United States Patent [19]

Popovic et al.

[11] Patent Number: 4,700,211
[45] Date of Patent: Oct. 13, 1987

[54] SENSITIVE MAGNETOTRANSISTOR MAGNETIC FIELD SENSOR

[75] Inventors: Radivoje Popovic, Steinhausen, Switzerland; Heinrich P. Baltes, Edmonton, Canada

[73] Assignee: LGZ Landis & Gyr Zug AG, Zug, Switzerland

[21] Appl. No.: 514,881

[22] Filed: Jul. 18, 1983

[30] Foreign Application Priority Data

Jul. 26, 1982 [GB] United Kingdom ................. 8221522
Nov. 30, 1982 [GB] United Kingdom ................. 8234054

[51] Int. Cl.$^4$ .................... H01L 27/22; H01L 43/00; H01L 29/72; G01R 33/02
[52] U.S. Cl. ...................................... 357/27; 357/35; 357/36; 324/252
[58] Field of Search .................. 324/251, 252; 357/27, 357/36, 35

[56] References Cited

U.S. PATENT DOCUMENTS 4,100,563  7/1978  Clark .
4,240,059 12/1980  Wolf .
4,253,107  2/1981  Macdougall ........................ 351/27
4,362,990 12/1982  Schneider et al. .

FOREIGN PATENT DOCUMENTS 3008308  5/1979  Fed. Rep. of Germany .
2918483 10/1980  Fed. Rep. of Germany .
2948762 12/1980  Fed. Rep. of Germany .
3133908 12/1980  Fed. Rep. of Germany .
8200225  1/1984  PCT Int'l Appl. .
3679829  6/1982  Switzerland .
 895629  5/1962  United Kingdom .
2050070 12/1980  United Kingdom .
2064140  6/1981  United Kingdom .

OTHER PUBLICATIONS

Mitnikova et al., "Investigations of the Characteristics . . ., Measuring Collectors", Sov. Phys. Semicond., Jan. 1978, pp. 26–28.
Beresford "Magnetic Transistors Exploit New Theory of Carrier Modulation", Electronics, May 19, 1982.

Primary Examiner—Gerard R. Strecker
Assistant Examiner—Walter E. Snow
Attorney, Agent, or Firm—Marmorek, Guttman & Rubenstein

[57] ABSTRACT

A magnetic field sensor having a lateral bipolar magnetotransistor incorporating only a single emitter region and whose base region is incorporated as a well in the surface of a silicon substrate of the reverse material conduction type. The P/N junction of the base region with the silicon substrate is reverse biased by means of at least one secondary collector contact. The emitter region must be kept as shallow than 0.5 μm or be so lowly doped with impurity atoms that its resistivity is greater than 100 ohms per square or both. The sensitivity of the magnetic field sensor is approximately 100%/Tesla.

8 Claims, 13 Drawing Figures

SENSITIVE MAGNETOTRANSISTOR MAGNETIC FIELD SENSOR

BACKGROUND OF THE INVENTION

The invention concerns a magnetic field sensor.

A magnetotransistor is, from the technological point of view, a more or less ordinary bipolar transistor so optimally designed that its electrical output characteristics, e.g. its collector current $I_c$ or its current amplification factor, are highly sensitive to the strength and orientation of a magnetic field. Known magnetotransistors have a voltage sensitivity ranging from 10 Volts/Tesla to 500 Volts/Tesla or a relative-current sensitivity ranging from 20%/Tesla to 30%/Tesla and preferably employ lateral bipolar transistors.

It is known from the reference "Investigation of the Characteristics of Silicon Lateral Magnetotransistors with Two Measuring Collectors", I. M. Mitnikova et al. Sov. Phys. Semicond. 12(1), January 1978, pp. 26-28, that among other things the magnetoconcentration has a strong influence on the sensitivity of a magnetotransistor.

It is known from the reference "Magnetic Transistors Exploit New Theory of Carrier Modulation", R. Beresford, Electronics, May 19, 1982, pp. 45-46, how a magnetic field modulates the injection of electrons into the emitter of a magnetotransistor.

Swiss Patent Application No. 3679/82, R. S. Popovic et al. describes a new concept for exploiting the magnetodiode effect.

U.S. Pat. No. 4,100,563 describes a magnetic field sensor having two collector regions and two base regions wherein the lines connecting each pair of same regions are mutually perpendicular and the magnetic field to be measured acts in a direction perpendicular to the surface of the magnetic field sensor.

SUMMARY OF THE INVENTION

It is therefore a principle object of the present invention to increase the sensitivity of known magnetic field sensors comprising lateral magnetotransistors. Such magnetic field sensors can be used as current sensors in the input circuit of an electric meter or as a position sensor in a magnetic limit switch.

The object is achieved in a magnetic field sensor having a lateral bipolar magnetotransistor incorporating only a single emitter region and whose base region is incorporated as a well in the surface of a silicon substrate of the reverse material conduction type. The P/N junction of the base region with the silicon substrate is reverse based by means of at least one secondary collector contact. The emitter region must be kept as shallow as possible in order to maintain a low degree of efficiency but not shallower than 0.5 μm or be so lowly doped with impurity atoms that its resistivity is greater than 100 Ohms per square or both. The sensitivity of the magnetic field sensor is approximately 100% Tesla.

Further objects and advantages of the invention will be set forth in part in the following specification, and in part will be obvious therefrom, without being specifically referred to, the same being realized and attained as pointed out in the claims thereof.

DESCRIPTION OF THE DRAWINGS

A sample embodiment of the invention is illustrated in the drawings and will be described in detail in relation thereto.

In all Figures of the drawings, the same reference numbers refer to the same components.

DESCRIPTION OF THE PREFERRED EMBODIMENTS

A bipolar NPN magnetotransistor will be described as a sample embodiment of the invention. However, the magnetic field sensor can equally well incorporate a PNP magnetotransistor instead of an NPN one as long as consideration is taken of the corresponding reversals of material conduction modes, which are well-known in transistor technology. The magnetic field sensor can be produced in CMOS technology.

Figure 1:
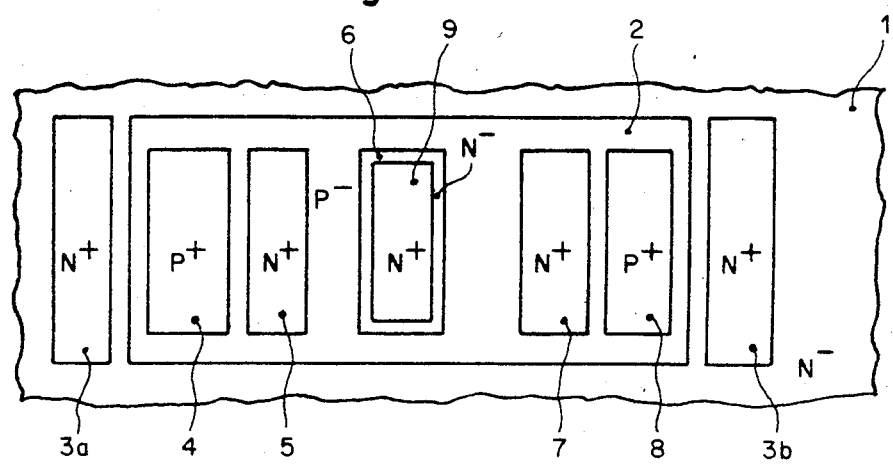
FIG. 1 is a plan view of a magnetic field sensor in accordance with an embodiment of the invention.
Figure 2:
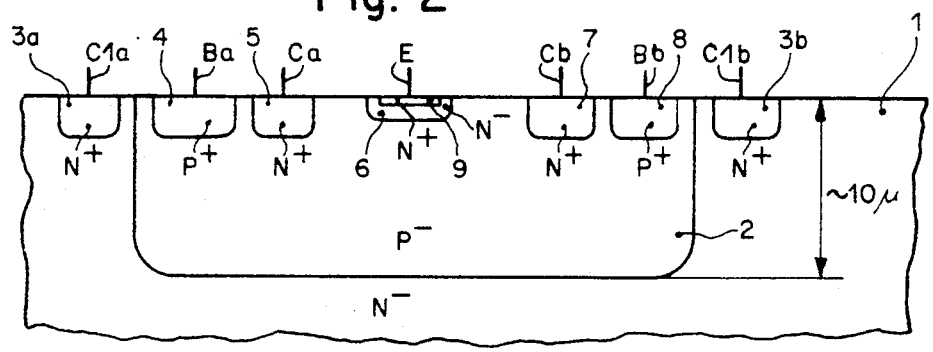
FIG. 2 is a cross-sectional view of FIG. 1.

Referring now to the drawings, in particular to FIGS. 1 and 2, the magnetic field sensor comprises an ordinary monocrystalline silicon substrate 1 consisting of N-material low-doped with impurities, namely N⁻ material having a resistivity of approximately 1 Ohm per cm. The following regions are formed in the surface of silicon substrate 1 by ionimplantation or by diffusion of impurity atoms or both into substrate 1 employing processing procedures known from integrated circuit technology:

a base layer 2 consisting of a P⁻ well formed by P-material low-doped with impurity atoms, and two N+ regions of substantially equal depth disposed on opposing sides of the P⁻ well and formed by N-material heavily doped with impurity atoms in order to form two laterally opposed secondary collector contacts 3a and 3b.

In the same manner, the following regions of substantially equal depth are adjacently aligned formed in the surface of the P⁻ well, reading from left to right in the drawing:

a first P+ subregion heavily doped with impurity atoms as a first base contact 4, a first N+ subregion heavily doped with impurity atoms as a first collector region 5, an N− subregion low-doped with impurity atoms as an emitter region 6, a second N+ subregion heavily doped with impurity atoms as a second collector region 7, and a second P+ subregion heavily doped with impurity atoms as a second base contact 8.

Emitter region 6 is disposed approximately in the middle of base region 2 and has upon its surface a relatively very shallow and heavily doped N+ surface layer forming an ohmic emitter contact 9. The other four regions are disposed symmetrically to emitter region 6. Each of the collector regions 5 and 7 is disposed between common emitter region 6 and one of the base contacts 4 and 8 belonging thereto. Both secondary collector contacts 3a and 3b, both collector regions 5 and 7 as well as emitter contact 9 may all be doped to an equal degree but are not limited thereto. Base region 2 preferably has a resistivity of one kilo-Ohm per square and a diffusion depth of approximately 10 μm. Base contacts 4 and 8 as well as collector regions 5 and 7 all have resistivities less than or equal to 50 Ohms per square and a diffusion depth greater than or equal to 1 μm.

A critical factor in the design of a magnetic field sensor is the dimensioning of emitter region 6. Its resistivity should be greater than 100 Ohms per square and its diffusion depth should be very shallow but not less than 0.5 μm, since the metallic emitter connector could otherwise easily break through the emitter-base junction.

Emitter contact 9 forms a good ohmic contact for accessing emitter region 6 in accordance with a method known from a description by R. S. Popovic in the journal Solid State Electronics, 21/1978, pp. 1133–1138. The Journal states:

The model of the contact considered here contains in the surface region a thin layer of homogeneous, high impurity concentration. The technology that could be used to meet such requirements is alloying. Because of the very poor control of geometry in alloying, the use is made of shallow diffusion profiles obtained by low-temperature phosphorus diffusions in silicon, reasonably resembling the "square" distributions [16].

The process of sample preparation was as follows: commercially available, polished, (III) oriented N-type silicon wafers of resistivities 4–6 Ωcm are used. Wafers were cleaned by standard procedure and steam oxidized at 950° C., for 30 min. Circular windows 5 μm in diameter were etched in the oxide by the photolithographic process. Wafers were then separated into several lots and each of them was subjected to phosphorus deposition from POCl$_3$[17] at 850° C., for different deposition times. Gas flow rates were adjusted to provide conditions for a high phosphorus glass deposition rate, e.g. the exceptionally anomalous impurity concentration profiles: N$_2$=1500 cm$^3$/min and O$_2$=300 cm$^3$/min (by pass) and N$_2$=60 cm/min (through bubbler). Phosphorus glass was then removed and aluminum was vacuum evaporated. Metal patterns were then defined by photolithography, FIG. 4. After that, the wafers were annealed in 20% H$_2$-80% N$_2$ gas mixture for one hour at 250°

C. According to the results of Ref. [18], under these conditions Al-Si contact is made almost completely free of interface states and oxide layer, without any dissolution of Si in Al.

FIG. 2 illustrates the P−/N− junction between base region 2 and silicon substrate 1 which acts as a reverse biased junction.

The remaining design details of the magnetic field sensor are known and are therefore not more closely illustrated in FIGS. 1 and 2. The entire device is coated with a passivation layer, e.g. silicon dioxide, which is not delineated in the Figures. The regions and contacts 3a, 4, 5, 9, 7, 8 and 3b each have a metallic connector lead, designated from left to right in the drawings as:

a first secondary collector lead Cla, a first base lead Ba, a first collector lead Ca, an emitter lead E a second collector lead Cb, a second base lead Bb, and a second secondary collector lead Clb.

Figure 3:
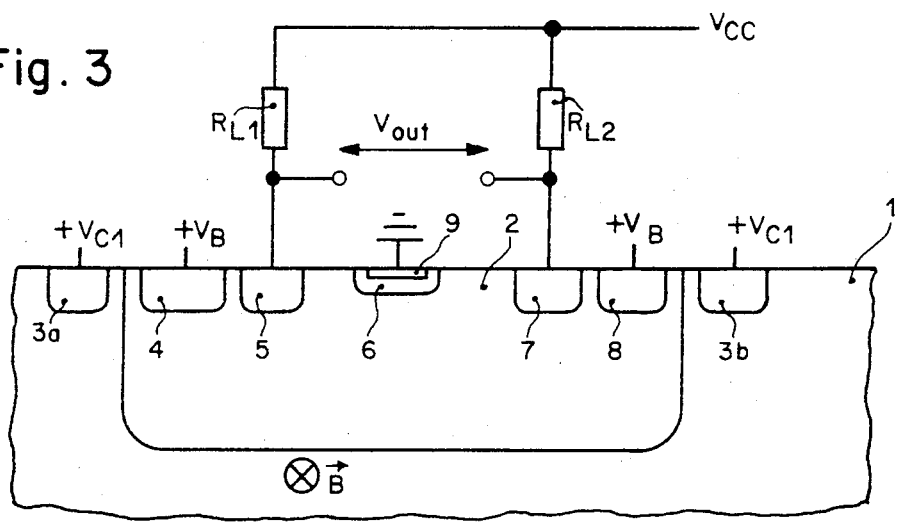
FIG. 3 is a circuit diagram similar to FIG. 2, but showing a modification.

In FIG. 3, emitter contact 9 and thereby emitter region 6 are externally grounded and a positive potential +V$_{cc}$ is imposed on first and second collector leads Ca and Cb via separate load resistances R$_{L1}$ and R$_{L2}$. These load resistances can be e.g. MOS transistors. An output voltage V$_{out}$ arises between collector leads Ca and Cb. There is a positive voltage +V$_B$ on both base leads Ba and Bb as well as a positive voltage +V$_{Cl}$ > +V$_B$ on the two secondary collector leads Cla and Clb. The circuit of FIG. 3 differs from usual known transistor circuits especially in that it incorporates on the one hand two secondary collector contacts 3a and 3b which have the sole purpose of imposing biasing voltage +V$_{Cl}$ upon silicon substrate 1 and on the other hand a P− well.

FIG. 3 presupposes the presence of a magnetic flux B parallel to the surface of the magnetic field sensor and perpendicular to the plane of the drawing. An advantageous embodiment of the magnetic field sensor is its use as a differential amplifier.

If a circuit having a unipolar output is required, either the left or the right half of the magnetic field sensor of FIG. 3 may be employed, including the corresponding part of the external circuitry.

Figure 4:
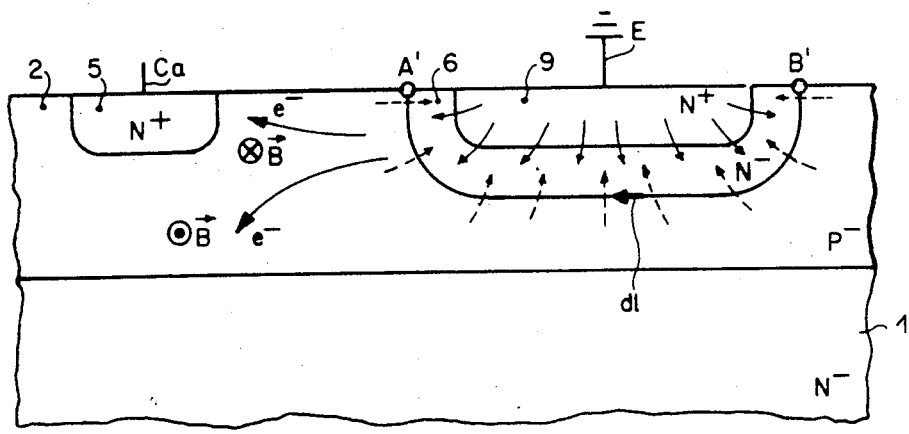
FIG. 4 is a circuit diagram showing a detail of FIG. 3.

In the detail view of FIG. 4, which shows emitter region 6 and first collector region 5 of the magnetic field sensor, solid arrows indicate the flow of electrons and dotted-line arrows indicate the migration of holes. The outer periphery of emitter region 6 extends from its first intersection with the upper surface at A′ to its second intersection B′ in the cross-section of FIG. 4.

An asymmetrical injection of electrons arises due to the build-up of potentials similar to Hall-effect potentials in the vicinity of the base-emitter junction. The charge carriers are furthermore deflected by the Lorentz force.

The Hall voltage generated along the curve A′B′ is:

$$V^H_{A'-B'} = \int_{B'}^{A'} \vec{E}^H \cdot d\mathbf{l}, \tag{1}$$

where $\vec{E}^H$ is the local Hall field and $\vec{dl}$ is an infinitesimally small segment of curve A′B′, and:

$$\vec{E}^H = R_H \vec{J} \times \vec{B} \tag{2}$$

where $R_H$ is the Hall coefficient, $\vec{B}$ is the magnetic flux vector and $\vec{J}$ is the local electric current density, and:

$$R_H = r \cdot 1/q \cdot (p - b^2 n)/(p + bn)^2 \quad (3),$$

$$b = \mu_n/\mu_p \quad (4),$$

and $$r = <\tau^2>/<\tau>^2$$

where:
- $<\tau^2>$ is the mean value of $\tau^2$,
- $<\tau>$ is the mean value of $\tau$,
- q is the charge of an electron,
- n is the electron density,
- p is the hole density,
- $\mu_n$ is the mobility of electrons,
- $\mu_p$ is the mobility of holes, and
- $\tau$ is the mean free time lapse between two collisions.

If the magnetic flux vector $\vec{B}$ is directed into the plane of the drawing (represented as ⊗ in FIG. 4), both types of charge carrier, electrons and holes, will be deflected along curve A'B' from surface intersection point B' towards surface intersection point A', in other words if their concentrations p and n are substantially the same, $R_H$ according to Equation (3), and consequently the Hall voltage, will tend to zero. However, should the efficiency of the emitter be very low, p will be much greater than n (p >> n). $R_H$ will equal $r/2p$ and surface intersection point A' will have a higher potential than surface intersection point B'. Correspondingly, FIG. 4 shows more electrons being injected to the left than to the right so that the corresponding current ratio is:

$$J_{A'}/J_{B'} = e(qV^H_{A'-B'})/kT \quad (6),$$

Furthermore, the charge carriers near surface intersection point A' will be deflected upwardly and be collected by first collector region 5, while the charge carriers injected near surface intersection point B' will be deflected downwardly and be collected by the silicon substrate 1. This effect further enhances the value of the current ratio according to Equation (6). The combination of both effects therefore substantially increases the sensitivity of the magnetic field sensor.

Figure 5:
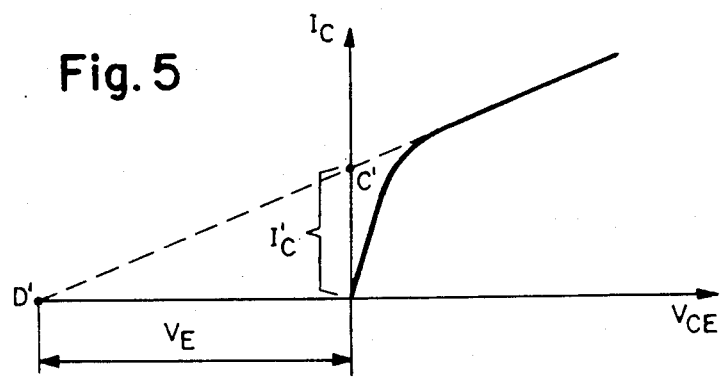
FIG. 5 is a characteristic curve of collector current $I_c$ as a function of the collector voltage $V_{ce}$ of the magnetic field sensor.

The collector output impedance of the magnetotransistor is:

$$r_c = \Delta V_c/\Delta I_c \approx V_E/I_c' \quad (7),$$

where $V_E$ and $I_c'$ can be interpreted from FIG. 5.

The greatest attainable collector output voltage of the magnetotransistor is:

$$\Delta V\text{max} = r_c \cdot \Delta I_c \quad (8),$$

and in consideration of Equation (8) the highest voltage-sensitivity is therefore:

$$S_V\text{max} = \Delta V\text{max}/\Delta B = r_c \cdot \Delta I_c/\Delta B \quad (9),$$

In consideration of Equation (7) it becomes:

$$S_V\text{max} = (V_E/I'_c) \cdot (\Delta I_c/\Delta B), \quad (10)$$

$$= V_E S_{IC} \text{ with } S_{IC} = (\Delta I_c/I'_c)/\Delta B. \quad (11)$$

The relative-current sensitivity thus attained in relation to the magnetic field is at least approximately three times larger than that heretofore attained with known magnetotransistor devices, i.e. 100%/Tesla.

A further advantage of the present magnetic field sensor is its small sensitive volume which is only $5 \times 10^{-5}$ mm in contrast to the $5 \times 10^{-3}$ mm mentioned by Mitnikova et al. The sensitive volume may be reduced still further, albeit at the expense of slightly reduced sensitivity, but is difficult to realize in known magnetic field sensors since it would entail a reduction of diffusion length.

In FIG. 5, the extension of the upper part of the characteristic curve $I_c = (V_{CE})$ intersects the axes of the graph at the ordinate C' representing a current value of $I_c'$ and at the abcissa D' representing a voltage value of $-V_E$.

The low relative-current sensitivity of known magnetotransistors is due to two factors:
- their emitter efficiency is higher than required, and
- their design is not optimized in relation to the effects of magnetoconcentration and in relation to the deflection of the carriers by the Lorentz force.

In the present invention, a high relative-current sensitivity is realized by:
- drastically reducing the efficiency of the emitter in comparison to that of normal magnetotransistors and normal bipolar transistors; this is achieved by using an emitter region 6 which is especially shallow or especially lowly doped with impurity atoms or both, and
- using a P/N junction which is reverse biased, specifically the P−/N− junction from base region 2 to silicon substrate 1, in contrast to known magnetotransistors in which the silicon substrate forms the base.

In order to achieve a highly sensitive magnetotransistor, the following prejudices had to be overcome:
- the opinion that an emitter must consist of heavily doped material, and
- the opinion that the employment of the silicon substrate as a base constitutes an adequate design.

The reverse biased P/N junction must fulfill the following three duties:
- it must further reduce the efficiency of the emitter by collecting the major portion of the charge carriers injected by the emitter,
- it must define and keep to a minimum the magnetically sensitive volume, and
- it must collect the ineffective electrons that are injected in the horizontal direction of the drawing, but then deflected to the silicon substrate as well as those that are injected perpendicularly to the surface of the magnetotransistor.

The emitter efficiency is:

$$\gamma = I_{iE}/I_{iB} \quad (12),$$

where $I_{iE}$ is the current injected into the base region 2 by the emitter and $I_{iB}$ is the current injected into the emitter region 6 by the base.

Figure 6:
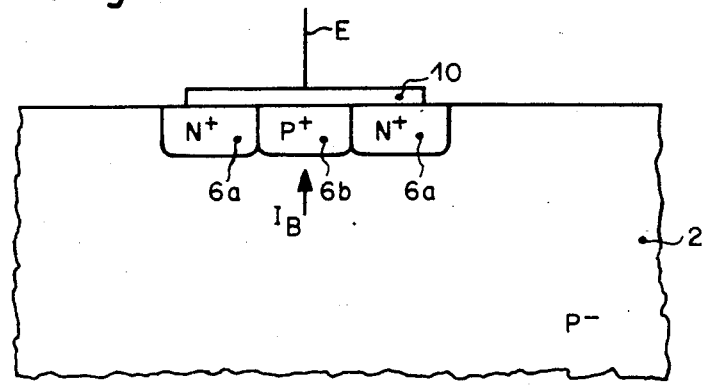
FIG. 6 is a circuit diagram similar to FIG. 2, but showing a further modification.
Figure 7:
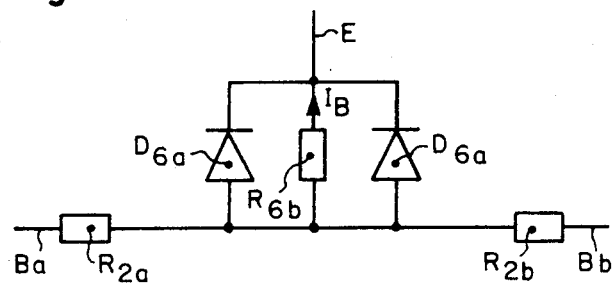
FIG. 7 is an equivalent circuit diagram of a magnetic field sensor according to FIG. 6.

By increasing I the emitter efficiency can be effectively reduced. This can be done by summing one or more current components $I_B$, which however must not lead to an increase in $I_{iE}$, by one of the following methods:

1. Division without interstices of emitter region 6 into three parallel adjoining subregions 6a, 6b and 6a according to FIG. 6, where both outer subregions 6a consist of N+ material, i.e. of heavily doped material of reverse conduction type to that of base region 2. The middle subregion 6b, on the other hand, consists of heavily doped material of the same conduction type as the base region 2, i.e. of P+ material. All three subregions are coated with a single metallic electrode layer 10. The junctions of the outer subregions 6a with base region 2 each form a diode $D_{6a}$ whose cathode is connected to emitter lead E. The middle subregion 6b has an internal resistance $R_{6b}$. Both diodes $D_{6a}$ as well as internal resistance $R_{6b}$ are, according to the equivalent circuit diagram of FIG. 7, in parallel between the emitter lead E and the common pole of both base resistances $R_{2a}$ and $R_{2b}$ of base region 2. $R_{2a}$ represents the resistance of that part of the base region 2 which lies between the base lead $B_a$ and the emitter region, and $R_{2b}$ represents the resistance of that part of the base region 2 which lies between the base lead $B_b$ and the emitter region. The electric current $I_B$ in resistance $R_{6b}$ is purely leakage current short-circuiting the actual emitter regions, i.e. the subregions 6a and 6b and therefore does not contribute to $I_{iE}$.

Figure 8:
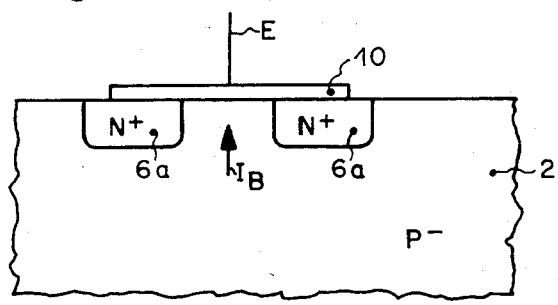
FIG. 8 is a circuit diagram similar to FIG. 2, but showing a further modification.
Figure 9:
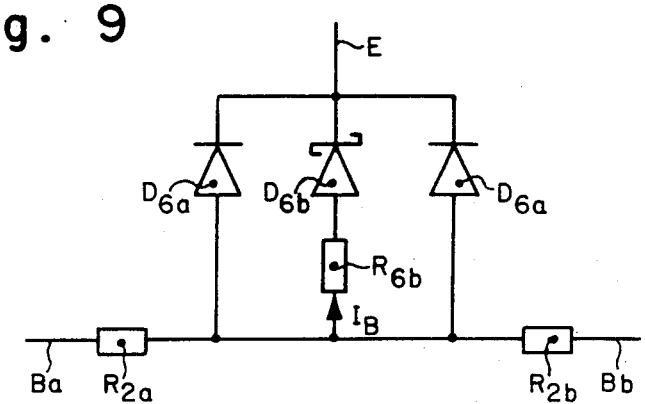
FIG. 9 is an equivalent circuit diagram of a magnetic field sensor according to FIG. 8.

2. Division according to FIG. 8 with elimination of the middle subregion 6b of method 1 and replacement by part of base region 2. This part now lies between the two subregions 6a, 6a and forms in conjunction with metallic electrode 10 a Schottky diode $D_{6b}$, having a serial internal resistance $R_{6b}$. This Schottky diode $D_{6b}$ with its serial resistance is in parallel with diodes $D_{6a}$, $D_{6a}$ and short-circuits them, so that the current $I_B$ in the serial circuit does not contribute to $I_{iE}$. The equivalent circuit diagram for FIG. 8 is given in FIG. 9.

3. Division without interstices of emitter region 6 according to FIG. 10 into several parallel, adjoining, mutually alternating subregions 6a and 6b consisting of heavily doped N+ and P+ material. The subregions 6b all have internal resistances $R_{6b}$ passing leakage currents $I_B$ which do not contribute to $I_{iE}$. Method 3 corresponds to method 1 except that here instead of two subregions 6a and one 6b, several of each are provided in alternation. All leakage currents $I_B$ add together and contribute strongly to the increase of $I_{iB}$ and thereby to the reduction of $\gamma$.

4. Division of emitter region 6 according to FIG. 12 into several parallel subregions 6a consisting of heavily doped N+ material which are all separated from one another by parts of base region 2. Each of these parts of the base region 2 forms in conjunction with metallic electrode 10 a Schottky diode Dhd 6b, each of which has a serial internal resistance $R_{6b}$. Each of these Schottky diodes passes a leakage current $I_B$ which does not contribute to $I_{iE}$. Method 4 corresponds to method 2, except that here instead of two subregions 6a several are provided. All leakage currents add together and strongly increase $I_{iB}$ without contributing to $I_{iE}$.

Figure 10:
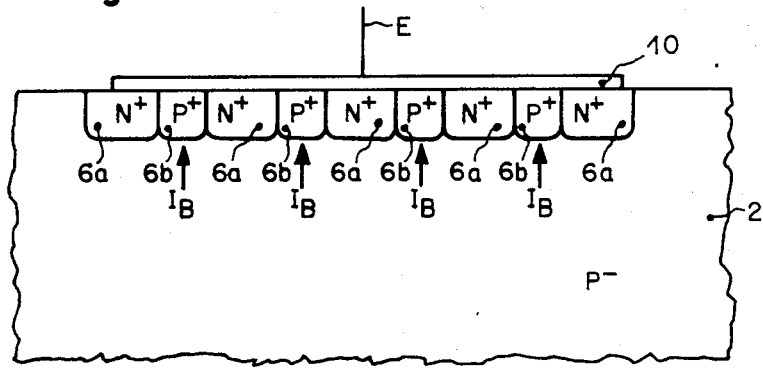
FIG. 10 is a circuit diagram showing a further modification.
Figure 11:
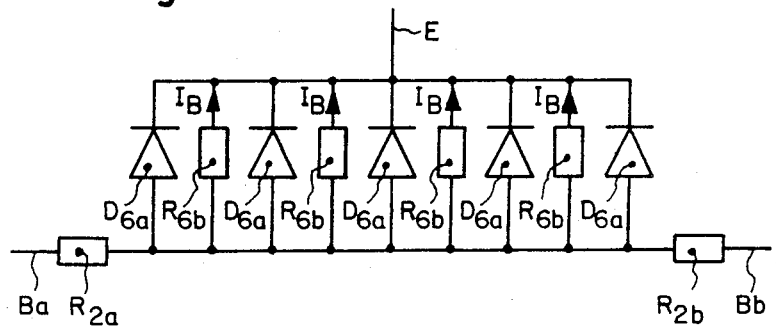
FIG. 11 is an equivalent circuit diagram of a magnetic field sensor according to FIG. 10.
Figure 12:
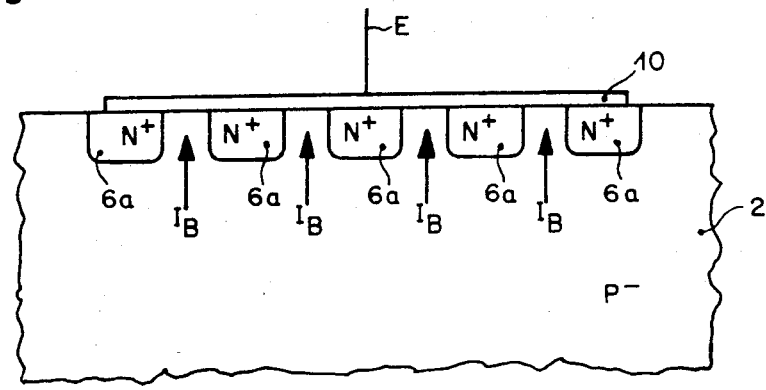
FIG. 12 is a circuit diagram showing a further modification.
Figure 13:
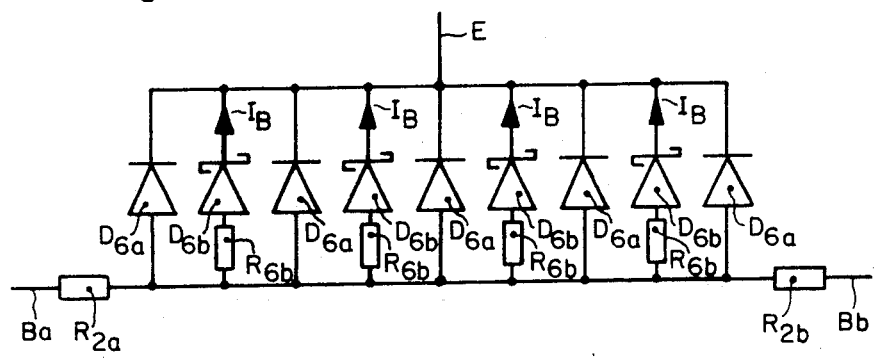
FIG. 13 is an equivalent circuit diagram of a magnetic field sensor according to FIG. 12.

FIGS. 11 and 13 each show the equivalent circuit diagram to FIGS. 10 and 12.

The magnetic field sensors described heretofore can be inserted as current meter converters at the entrance of electric meters for measuring the electrical current used. This current measured value then serves subsequently in connection with a voltage measured value for ascertaining the electrical energy used.

There are basically two modifications (readings) A and B for realizing such electric meters electronically.

The modification A is described in DE-O 29 48 762 (=GB-OS 20 140).

The GB-OS 20 64 140 states:

According to the present invention there is provided a measuring transducer for measuring a magnetic field, comprising a magnetic coil for carrying an alternating bias magnetisation current, a current source, and a magnetic field comparator which is connected to the current source, which comprises at least one antisotropic magnetic film of ferromagnetic magnetoresistive material, and which is arranged to be exposed to an external magnetic field corresponding to the sum of the magnetic field corresponding to the sum of the magnetic field to be measured and a bias magnetisation current such that the magnetic film is switched alternately into both directions of saturation by the external field in its magnetic preferential direction and abruptly alters its electrical resistance approximately whenever the external field passes through zero, so that the moment in time of the change in resistance represents a measurement in respect to the magnitude and the sign of the magnetic field to be measured, the magnetic field comparator to be measured, the magnetic field comparator being arranged on a semiconductor wafer of a monolithic integrated circuit.

In this modification A the magnetic field created by the used and to be measured current is scanned by means of a reference magnetic field and the zero values of the difference of the two magnetic fields are utilized electronically. For instance, the reference magnetic field is saw-tooth shaped and is created by means of a reference current. The reference current and the used current to be measured flow each through a separate flat coil mounted on the surface of the magnetic field sensor or through a separate flat conductor which is arranged near the surface of the magnetic field sensor and parallel thereto. The flat conductor may also be bent in U-shaped and surround in U-shaped the magnetic field sensor mounted in a housing. The DE-OS 31 33 908 discloses a system comprising a volt and current generator feeding a bridge arrangement of four ferromagnetic thin films, the output of the bridge arrangement is coupled to a differential amplifier, another current source drives a coil to produce a first magnetic field while the output of the differential amplifier drives a coil to produce an opposing second magnetic field, and an output resistor is in the circuit of the current to produce the opposing second magnetic field to provide a voltage measurement related to that current. The two coils are in the vicinity of the ferromagnetic bridge for sensing the difference between the magnetic fields produced by the two coils and providing an input to the differential amplifier in accordance with the resultant magnetic field.

The modification B is described in DE-OS 31 33 908 (corresponds to U.S. Pat. No. 4,596,950 of Lienhard et al). In this modification B the magnetic field created by the used and to be measured current is compensated for by means of a compensating magnetic field and a compensating current that generates this compensating magnetic field, and which is furnished by a control circuit and is subsequently utilized electronically. In order to produce the corresponding magnetic fields, the current to be measured and the compensating current each flows through a flat conductor which is arranged near the surface of the magnetic field sensor, or each flows through a flat coil which is mounted on the surface of the magnetic field sensor. In a preferred arrangement, also here the flat conductors are bent in U-shape and surround in U-shape the magnetic field sensor mounted in a housing.

In all applications the needed electronic circuits are preferably integrated in the same substrate into which also the magnetic field sensor is integrated, so that in the ideal case there is only one single common intergrated circuit.

In order to increase the density of the magnetic fields, the substrate containing the magnetic field sensor is arranged in preferred arrangements within or in the immediate vicinity of the air gap of magnetic core with its surface parallel to the magnetic fields, for example according to one of the mounting methods described in DE-OS 29 18 483 (=U.S. Pat. No. 4,362,990). In these cases it suffices to replace a substrate used there with magnetic film mounted thereon by the magnetic field sensor.

Until now it was assumed that the total used current is measured in the magnetic field sensor. However, if this current is very big, it suffices to feed a constant and known fraction of this current into the magnetic field sensor in the form of a magnetic field.

This is done according to one of the three following methods:

In a first method, with current divider among others described in DE-PS 30 08 308 (=GB-PS 20 50 070), a portion of the current to be measured is kept at a distance from the magnetic field sensor by means of a shunt.

The GP-PS 20 50 070 discloses the following:

According to the present invention there is provided a current divider for measuring transducers for the potential-free measurement of currents, the current divider comprising a current conductor which is formed by a band-shaped metal strip, which carries the total current to be measured, and which is divided into a measuring conductor and a shunt, in the direction of current flow upstream of a measuring location, said measuring conductor and said shunt being reunited downstream of the measuring location to reform the original current conductor, and wherein in use the measuring conductor passes through a magnetic circuit forming the measuring system of the measuring transducer, said metal strip comprising a web portion extending in the longitudinal direction (said metal strip, and two strip portions, said web portion and said strip portions being joined again at end regions at the two narrow ends of said metal strip, to restore the original configuration of said metal strip; wherein said web portion serves as said measuring conductor and said strip portions form said shunt and for this purpose said web portion on the one hand and said strip portions on the other hand are so shaped that they are displaced in different directions; and wherein in addition said strip portions form at least one U-shaped bend with limb portions which lie closely one beside the other.

In a second method, the bridge method described in U.S. Pat. No. 4,240,059, the current to be measured is fed to a measuring bridge in such a manner that only the portion flowing in the diagonal branch of the measuring bridge reaches the magnetic field sensor and is utilized by the latter.

A third method, described in the International patent application WO 83/01 535, provides for feeding the current to be measured to a current transformer the primary winding of which comprises two conductors being wound in opposite directions and having approximately the same resistance wherein the current to be measured branches into the oppositely wound conductors. International patent application WO 83/01 535 corresponds to the U.S. patent application of Richard Friedl PCT/EP 82/0025 filed on June 9, 1983.

The international patent application discloses the following:

The arrangement according to the invention of an active current sensor with primary reducing winding permits the size of a current sensor to be drastically reduced without noticeably reducing the measuring range and the degree of measuring accuracy as with that construction of primary winding, it is only necessary to detect the difference between the currents flowing in the two conductors, and the geometry of the winding makes it possible for both conductors to be laid in mechanical contact over their entire length between the junction points so that both conductors are always at the same temperature.

The arrangement, in accordance with the invention, of a current sensor with primary reducing winding means that any modulation signals which may be conditional on the principle concerned, for detecting direct current, are not interfered with as the fact that the two conductors of the reducing winding are wound in opposite directions, with the same number of turns, means that the voltages induced by the modulation signals in the conductors are in opposite directions and therefore there is no possibility of a compensating current being formed across the junction of the conductors.

I wish it to be understood that I do not desire to be limited to the exact details of construction shown and described, for obvious modifications will occur to a person skilled in the art.

Having thus described the invention, what I claim as new and desire to be secured by Letters Patent is as follows:

1. A magnetic field sensor comprising a lateral bipolar magnetotransistor having in combination only one single emitter region, at least one collector region and a base region being low-doped with impurity atoms having at least one base contact heavily doped with impurity atoms, with said base region incorporated in the surface of a silicon substrate that is low-doped with impurity atoms and of reversed conduction type, the P/N junction between said base region and said substrate is reverse biased by means of at least one secondary collector contact provided in the surface of said silicon substrate and wherein said magnetotransistor's emitter region, collector regions and base contacts are adjacently aligned, said single emitter region being divided into two outer subregions adjoining a middle subregion free from interstices, all of which are mutually parallel and heavily doped and in which said middle subregion is of the same conduction type as said base region, while said two outer subregions are of the reversed conduction type.

2. A magnetic field sensor according to claim 1, wherein said emitter region is substantially shallow but having a depth of at least 0.5 μm.

3. A magnetic field sensor according to claim 1, wherein said middle subregion is formed by parts of said base region.

4. A magnetic field sensor according to claim 1, wherein said single emitter region is divided free from interstices into multiple parallel subregions of alternating N+ and P+ material heavily doped with impurity atoms.

5. A magnetic field sensor according to claim 4, wherein the subregions having the same conduction type material as said base region are formed by parts of said base region.

6. A magnetic field sensor according to claim 1, wherein said emitter region is so lowly doped with impurity atoms that is resistivity is greater than 100 Ohms per square.

7. A magnetic field sensor according to claim 1, wherein said emitter region is substantially shallow, but having a depth of at least 0.5 μm and is so lowly doped with impurity atoms that its resistivity is greater than 100 Ohms per cm.

8. A magnetic field sensor including a magneto-transistor comprising:
- a low-doped semiconductor substrate of a first conductivity type,
- a low-doped base region of a second conductivity type formed in the surface of said substrate, a P/N junction being defined between said base region and said substrate, and
- a secondary collector formed in the surface of said substrate capable of reverse biasing said P/N junction,
- said magneto-transistor further including an emitter region, a pair of collector regions and a pair of base contacts aligned with one another at the surface of said base region, said emitter region comprising at least two regions of said first conductivity type, separated by a region of said second conductivity type.

* * * * *